US011444260B2

(12) United States Patent
Choi et al.

(10) Patent No.: US 11,444,260 B2
(45) Date of Patent: Sep. 13, 2022

(54) FOLDABLE ELECTRONIC DEVICE INCLUDING BEZEL SAG PREVENTING STRUCTURE

(71) Applicant: SAMSUNG ELECTRONICS CO., LTD., Suwon-si (KR)

(72) Inventors: Jonghwan Choi, Suwon-si (KR);
Daeyoung Kim, Suwon-si (KR);
Chijoon Kim, Suwon-si (KR);
Jungwon Park, Suwon-si (KR);
Hyosang An, Suwon-si (KR);
Hyunggeun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 115 days.

(21) Appl. No.: 16/793,210

(22) Filed: Feb. 18, 2020

(65) Prior Publication Data

US 2020/0266384 A1    Aug. 20, 2020

(30) Foreign Application Priority Data

Feb. 18, 2019    (KR) .................. 10-2019-0018606

(51) Int. Cl.
*H05K 5/00* (2006.01)
*H05K 5/02* (2006.01)
(Continued)

(52) U.S. Cl.
CPC ....... *H01L 51/5237* (2013.01); *H05K 5/0017* (2013.01); *H05K 5/0226* (2013.01); *H01L 27/3244* (2013.01); *H01L 2251/5338* (2013.01)

(58) Field of Classification Search
CPC .. H05K 5/0217; H05K 5/0017; H05K 5/0086; H05K 5/03; G06F 1/1616; G06F 1/1652; H04M 1/0214; H04M 1/0268
See application file for complete search history.

(56) References Cited

U.S. PATENT DOCUMENTS 6,577,496 B1 *  6/2003  Gioscia .................. G06F 1/1616
                                            345/156
6,654,078 B1 * 11/2003  Kato .................. G02F 1/133308
                                            349/58
(Continued)

FOREIGN PATENT DOCUMENTS

JP       2006-235746      9/2006
KR    10-2015-0092066     8/2015
(Continued)

OTHER PUBLICATIONS

International Search Report and Written Opinion dated Jun. 11, 2020 in counterpart International Patent Application No. PCT/KR2020/002265.

(Continued)

*Primary Examiner* — Abhishek M Rathod
(74) *Attorney, Agent, or Firm* — Nixon & Vanderhye P.C.

(57) ABSTRACT

An electronic device is disclosed. An electronic device may include: a foldable housing including a hinge, a first housing connected to the hinge and including a first surface oriented in a first direction and a second surface oriented in a second direction opposite the first direction, a second housing connected to the hinge and including a third surface oriented in a third direction and a fourth surface oriented in a fourth direction opposite the third direction, wherein the second housing is configured to be folded on the first housing about the hinge, and side surfaces surrounding at least a part of a space between the first surface and the second surface and at least a part of a space between the third surface and the fourth surface; and a display having ductility and extending from the first surface to the third surface to configure the first surface and the third surface, wherein the foldable housing is disposed along an edge of the display and includes bezels extending from respective side surfaces to an active area of the display, and wherein the bezels include, in an area (Continued)

configuring the first surface and the third surface of the foldable housing, extensions spaced apart from edge portions of the display, and support portions disposed between the edge of the display and the extensions to be in contact with the edge portions of the display.

20 Claims, 11 Drawing Sheets

(51) Int. Cl.
  *H01L 51/52* (2006.01)
  *H01L 27/32* (2006.01)

(56) References Cited

U.S. PATENT DOCUMENTS

| | | | | |
|---|---|---|---|---|
| 7,852,424 | B2* | 12/2010 | Sugawara | G02F 1/133308 |
| | | | | 349/58 |
| 10,371,887 | B2* | 8/2019 | Sugimoto | G02F 1/133308 |
| 2004/0036818 | A1 | 2/2004 | Kim et al. | |
| 2014/0028948 | A1* | 1/2014 | Hsiao | G02B 6/0088 |
| | | | | 349/58 |
| 2014/0029171 | A1* | 1/2014 | Lee | G09F 9/301 |
| | | | | 361/679.01 |
| 2014/0029190 | A1 | 1/2014 | Sato et al. | |
| 2014/0204310 | A1* | 7/2014 | Lee | G02B 6/0073 |
| | | | | 349/62 |
| 2015/0062787 | A1* | 3/2015 | Wilson | H04M 1/185 |
| | | | | 361/679.01 |
| 2015/0255023 | A1 | 9/2015 | Lee et al. | |
| 2015/0366089 | A1* | 12/2015 | Park | G06F 1/1641 |
| | | | | 361/679.01 |
| 2016/0037655 | A1* | 2/2016 | Im | G02F 1/133308 |
| | | | | 359/483.01 |
| 2018/0070468 | A1* | 3/2018 | Yanagisawa | H05K 5/0017 |
| 2018/0150102 | A1* | 5/2018 | Lee | G06F 1/1675 |
| 2018/0160553 | A1 | 6/2018 | Yeh | |
| 2018/0366284 | A1 | 12/2018 | Hao | |

FOREIGN PATENT DOCUMENTS

| | | |
|---|---|---|
| KR | 10-1749728 | 10/2015 |
| KR | 10-2016-0047869 | 5/2016 |

OTHER PUBLICATIONS

Extended European Search Report dated Mar. 25, 2022 for EP Application No. 20759484.7.

* cited by examiner

FOLDABLE ELECTRONIC DEVICE INCLUDING BEZEL SAG PREVENTING STRUCTURE

CROSS-REFERENCE TO RELATED APPLICATION

This application is based on and claims priority under 35 U.S.C. § 119 to Korean Patent Application No. 10-2019-0018606, filed on Feb. 18, 2019, in the Korean Intellectual Property Office, the disclosure of which is incorporated by reference herein in its entirety.

BACKGROUND

1) Field

The disclosure relates to a foldable electronic device including a bezel sag preventing/reducing structure.

2) Description of Related Art

As digital technology develops, electronic devices are being provided in various mobile devices such as a smartphone, a tablet personal computer (tablet PC), and a personal digital assistant (PDA). Mobile electronic devices are being developed to improve the mobility and a user's convenience. Each of various electronic devices may include a display as a user interface, and a touch-sensitive display is widely used recently.

In addition, in order to ensure the portability, demand for an electronic device including a foldable display has been increased. An electronic device including a foldable display can be used as a smartphone in the folded state and as a large screen tablet PC in the unfolded state, and thus can increase a user's convenience and the usability.

A flexible display may include a substrate and a window which are made of a ductile material such as polyimide (PI). A flexible display may be used in an unfolded state if a large screen is needed, and may be used in a folded state if the display is carried or simply and conveniently used. A display includes a plurality of layers, and thus forces in different directions or different sizes may be applied to a display layer disposed outside and a display layer disposed inside in a folded state of the display. If compressive forces or tensile forces in various sizes are applied to layers of a display, respectively, the layers may slip.

If a structure (e.g. bezel) for protecting a display of a flexible electronic device sags and comes into contact with the display, the surface of the display may be damaged, and the slipping of the display may cause damage. In addition, moisture or foreign materials may be introduced through the gap between a protective structure and a display for protection of the surface of the display.

A method for preventing and/or reducing damage to the surface of a flexible display and preventing and/or reducing introduction of moisture and foreign materials through the gap between the display and a protective structure is required.

The above information is presented as background information only to assist with an understanding of the disclosure. No determination has been made, and no assertion is made, as to whether any of the above might be applicable as prior art with regard to the disclosure.

SUMMARY

Embodiments of the disclosure provide an electronic device having a structure configured to prevent and/or reduce damage to the surface of a display occurring at the time of folding the display, or to prevent and/or reduce inward introduction of moisture or foreign materials passing through a gap between a bezel and the display.

Embodiments of the disclosure provide an electronic device that can maintain the gap between a display and a bezel and prevent and/or reduce a bezel sag according to the use of the electronic device.

An electronic device according to an example embodiment may include: a foldable housing including a hinge, a first housing connected to the hinge and including a first surface oriented in a first direction and a second surface oriented in a second direction opposite the first direction, a second housing connected to the hinge and including a third surface oriented in a third direction and a fourth surface oriented in a fourth direction opposite the third direction, wherein the second housing is configured to be folded on the first housing about the hinge, and side surfaces surrounding at least a part of a space between the first surface and the second surface and at least a part of a space between the third surface and the fourth surface; and a display having ductility and extending from the first surface to the third surface to configure the first surface and the third surface, wherein the foldable housing is disposed along an edge of the display and includes bezels extending from the side surfaces to an active area of the display, and wherein the bezels include, in an area of the first surface and the third surface of the foldable housing, extensions spaced apart from edges of the display, and supports disposed between portions of the edges of the display and the extensions to be in contact with the edges of the display.

An electronic device according to another example embodiment may include: a hinge configured to enable the electronic device to be switched into a folded state or an unfolded state; a first housing connected to the hinge and including a first surface oriented in a first direction and a second surface oriented in a second direction opposite the first direction; a second housing connected to the hinge and including a third surface oriented in a third direction and a fourth surface oriented in a fourth direction opposite the third direction, wherein the second housing is configured to be folded on the first housing about the hinge; a flexible display configured from the first surface to the third surface; a first bracket disposed in a space between the first surface and the second surface configured to support a part of the flexible display; a second bracket disposed in a space between the third surface and the fourth surface configured to support a remaining part of the flexible display; and a bezel including an extension in contact with a part of the first bracket or a part of the second bracket and extending toward an edge of the display, and a support being in contact with the edge of the display.

An electronic device according to various embodiments can prevent and/or reduce damage to the surface of a display, occurring at the time of folding the display, or prevent and/or reduce inward introduction of moisture or foreign materials passing through the gap between a bezel and the display.

An electronic device can maintain the gap between a display and a bezel and prevent a bezel sag according to the use of the electronic device.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
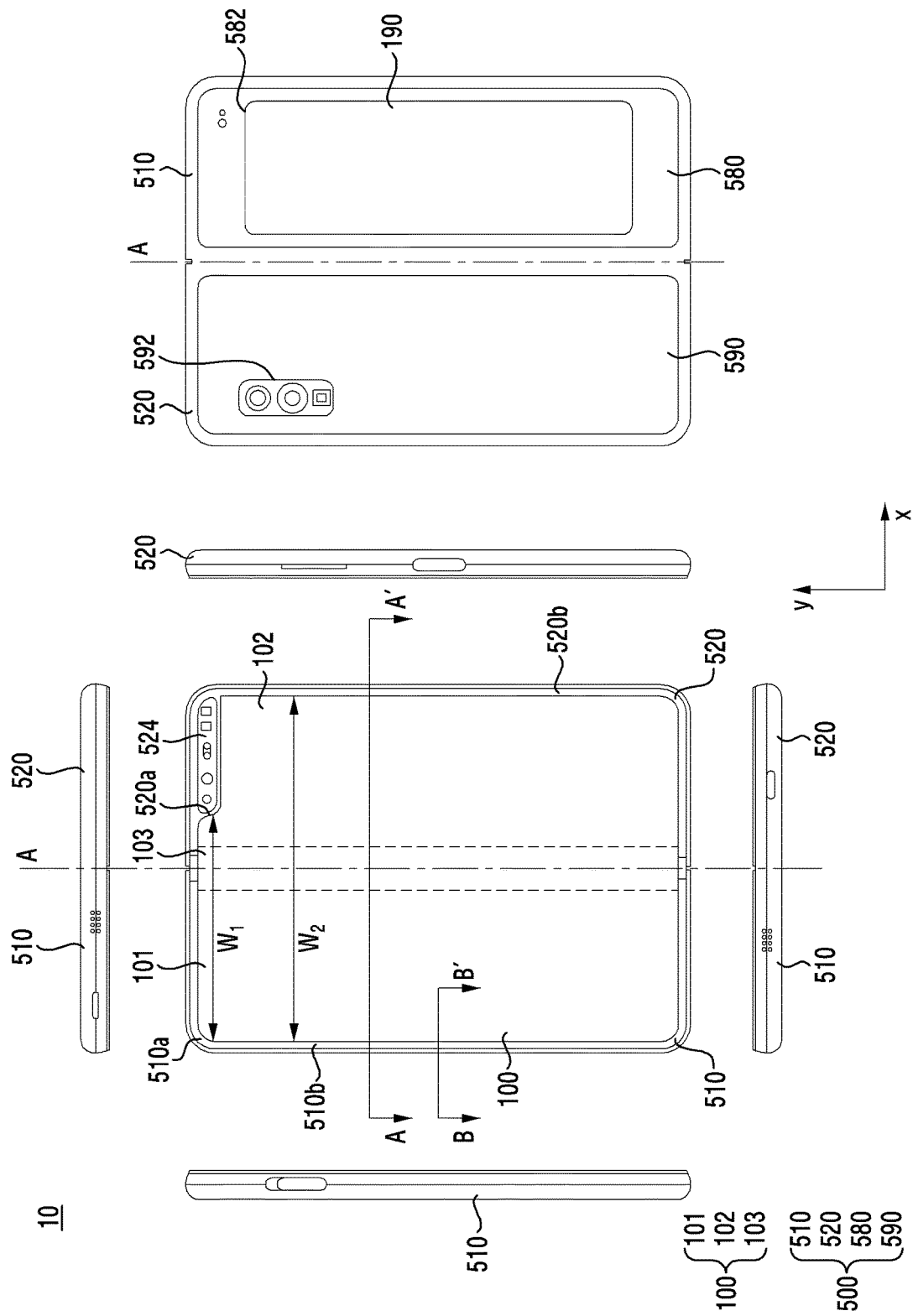
FIG. 1 is a diagram illustrating an example electronic device in an unfolded state according to an embodiment.
Figure 2:
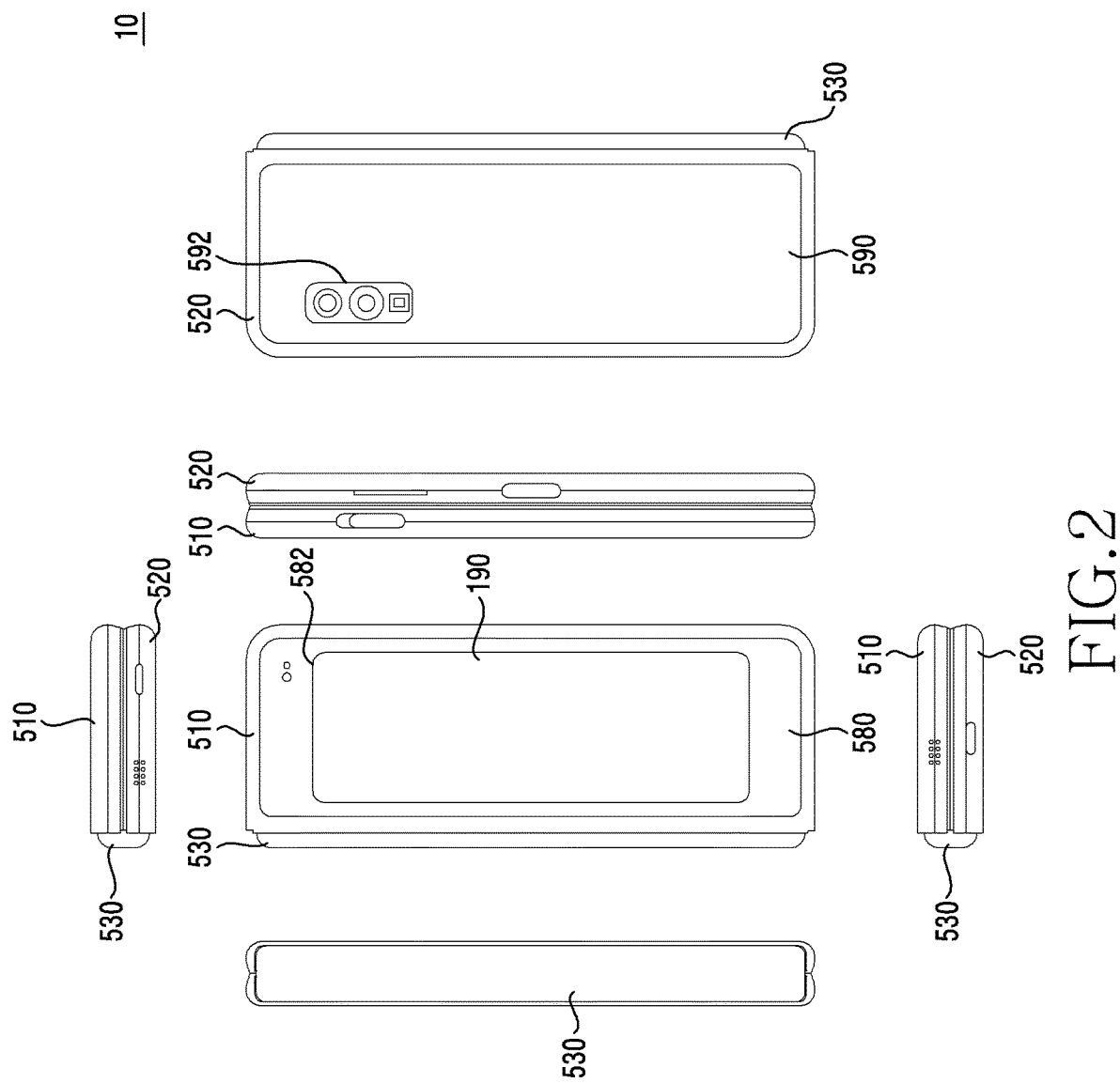
FIG. 2 is a diagram illustrating an example electronic device in a folded state according to an embodiment.

FIG. 1 is a diagram illustrating an example electronic device in an unfolded (e.g., flat) stat according to an embodiment. FIG. 2 is a diagram illustrating the example electronic device in a folded state according to an embodiment. In an embodiment, the electronic device 10 may have the flat state or the unfolded state illustrated in FIG. 1, the folded state illustrated in FIG. 2, and an intermediate state between the flat state and the folded state. As used herein, the term "folded state" refers to a "fully folded state" unless specifically stated otherwise, and an illustration of the intermediate state in which the electronic device 10 is folded with a certain angle will be separately described.

Referring to FIGS. 1 and 2, in an embodiment, the electronic device 10 may include a foldable housing 500, a hinge cover 530 that covers a foldable portion of the foldable housing 500, and a flexible or foldable display 100 (hereinafter, abbreviated to the "display 100") that is disposed in a space formed by the foldable housing 500. In this disclosure, a surface on which the display 100 is disposed is defined as a first surface or a front surface of the electronic device 10. A surface opposite to the front surface is defined as a second surface or a rear surface of the electronic device 10. A surface that surrounds a space between the front surface and the rear surface is defined as a third surface or a side surface of the electronic device 10.

In an embodiment, the foldable housing 500 may include a first housing structure 510, a second housing structure 520 including a sensor area 524, a first back cover 580, and a second back cover 590. The foldable housing 500 of the electronic device 10 is not limited to the form and the coupling illustrated in FIGS. 1 and 2 and may be implemented by a combination and/or a coupling of other shapes or parts. For example, in another embodiment, the first housing structure 510 and the first back cover 580 may be integrally formed with each other, and the second housing structure 520 and the second back cover 590 may be integrally formed with each other.

In the illustrated embodiment, the first housing structure 510 and the second housing structure 520 may be disposed on opposite sides of a folding axis (an axis A) and may have substantially symmetrical shapes with respect to the folding axis A. As will be described below, the angle or distance between the first housing structure 510 and the second housing structure 520 may vary depending on whether the electronic device 10 is in a flat, folded, or intermediate state. In the illustrated embodiment, unlike the first housing structure 510, the second housing structure 520 may additionally include the sensor area 524 in which various sensors are arranged, but may have a symmetrical shape in the other area.

In an embodiment, as illustrated in FIG. 1, the first housing structure 510 and the second housing structure 520 may form a recess together in which the display 100 is received. In the illustrated embodiment, due to the sensor area 524, the recess may have two or more different widths in a direction perpendicular to the folding axis A.

For example, the recess may have a first width w1 between a first portion 510a of the first housing structure 510 that is parallel to the folding axis A and a first portion 520a of the second housing structure 520 that is formed on the periphery of the sensor area 524 and a second width w2 formed by a second portion 510b of the first housing structure 510 and a second portion 520b of the second housing structure 520 that does not correspond to the sensor area 524 and that is parallel to the folding axis A. In this case, the second width w2 may be formed to be longer than the first width w1. In other words, the first portion 510a of the first housing structure 510 and the first portion 520a of the second housing structure 520 that have asymmetrical shapes may form the first width w1 of the recess, and the second portion 510b of the first housing structure 510 and the second portion 520b of the second housing structure 520 that have symmetrical shapes may form the second width w2 of the recess. In an embodiment, the first portion 520a and the second portion 520b of the second housing structure 520 may have different distances from the folding axis A. The widths of the recess are not limited to the illustrated examples. In various embodiments, the recess may have a plurality of widths by the form of the sensor area 524 or by the portions of the first housing structure 510 and the second housing structure 520 that have asymmetrical shapes.

In an embodiment, at least a part of the first housing structure 510 and the second housing structure 520 may be formed of metal or non-metal having strength selected to support the display 100.

In an embodiment, the sensor area 524 may be formed to have a predetermined area adjacent to one corner of the second housing structure 520. However, the arrangement, shape, and size of the sensor area 524 are not limited to the illustrated example. For example, in another embodiment, the sensor area 524 may be provided in another corner of the second housing structure 520 or in any area between an upper corner and a lower corner of the second housing structure 520. In an embodiment, parts embedded in the electronic device 10 to perform various functions may be exposed on the front surface of the electronic device 10 though the sensor area 524 or through one or more openings formed in the sensor area 524. In various embodiments, the parts may include various types of sensors. The sensors may include, for example, at least one of a front camera, a receiver, or a proximity sensor.

The first back cover 580 may be disposed on one side of the folding axis A on the rear surface of the electronic device 10 and may have, for example, a substantially rectangular periphery that is surrounded by the first housing structure 510. Similarly, the second back cover 590 may be disposed on an opposite side of the folding axis A on the rear surface of the electronic device 10 and may have a periphery surrounded by the second housing structure 520.

In the illustrated embodiment, the first back cover 580 and the second back cover 590 may have substantially symmetrical shapes with respect to the folding axis (the axis A). However, the first back cover 580 and the second back cover 590 do not necessarily have symmetrical shapes, and in another embodiment, the electronic device 10 may include the first back cover 580 and the second back cover 590 in various shapes. In another embodiment, the first back cover 580 may be integrally formed with the first housing structure 510, and the second back cover 590 may be integrally formed with the second housing structure 520.

In an embodiment, the first back cover 580, the second back cover 590, the first housing structure 510, and the second housing structure 520 may form a space in which various parts (e.g., a printed circuit board or a battery) of the electronic device 10 are disposed. In an embodiment, one or more parts may be disposed or visually exposed on the rear surface of the electronic device 10. For example, at least part of a sub-display 190 may be visually exposed through a first rear area 582 of the first back cover 580. In another embodiment, one or more parts or sensors may be visually exposed through a second rear area 592 of the second back cover 590. In various embodiments, the sensors may include a proximity sensor and/or a rear camera.

Referring to FIG. 2, the hinge cover 530 may be disposed between the first housing structure 510 and the second housing structure 520 to hide internal parts (e.g., hinge structures). In an embodiment, the hinge cover 530 may be hidden by part of the first housing structure 510 and part of the second housing structure 520, or may be exposed to the outside, depending on a state (e.g., a flat state or a folded state) of the electronic device 10.

For example, when the electronic device 10 is in a flat state as illustrated in FIG. 1, the hinge cover 530 may be hidden by the first housing structure 510 and the second housing structure 520 and thus may not be exposed. In another example, when the electronic device 10 is in a folded state (e.g., a fully folded state) as illustrated in FIG. 2, the hinge cover 530 may be exposed between the first housing structure 510 and the second housing structure 520 to the outside. In another example, when the electronic device 10 is in an intermediate state in which the first housing structure 510 and the second housing structure 520 are folded with a certain angle, the hinge cover 530 may be partially exposed between the first housing structure 510 and the second housing structure 520 to the outside. However, in this case, the exposed area may be smaller than that when the electronic device 10 is in a fully folded state. In an embodiment, the hinge cover 530 may include a curved surface.

The display 100 may be disposed in the space formed by the foldable housing 500. For example, the display 100 may be mounted in the recess formed by the foldable housing 500 and may form almost the entire front surface of the electronic device 10.

Accordingly, the front surface of the electronic device 10 may include the display 100, and a partial area of the first housing structure 510 and a partial area of the second housing structure 520 that are adjacent to the display 100. The rear surface of the electronic device 10 may include the first back cover 580, a partial area of the first housing structure 510 that is adjacent to the first back cover 580, the second back cover 590, and a partial area of the second housing structure 520 that is adjacent to the second back cover 590.

The display 100 may refer to a display, at least a partial area of which is able to be transformed into a flat surface or a curved surface. In an embodiment, the display 100 may include a folding area 103, a first area 101 disposed on one side of the folding area 103 (on a left side of the folding area 103 illustrated in FIG. 1), and a second area 102 disposed on an opposite side of the folding area 103 (on a right side of the folding area 103 illustrated in FIG. 1).

The areas of the display 100 illustrated in FIG. 1 are illustrative, and the display 100 may be divided into a plurality of (e.g., four or more, or two) areas according to a structure or function of the display 100. For example, in the embodiment illustrated in FIG. 1, the areas of the display 100 may be divided from each other by the folding area 103 or the folding axis (the axis A) that extends in parallel to the y-axis. However, in another embodiment, the display 100 may be divided into areas with respect to another folding area (e.g., a folding area parallel to the x-axis) or another folding axis (e.g., a folding axis parallel to the x-axis).

The first area 101 and the second area 102 may have substantially symmetrical shapes with respect to the folding area 103. However, unlike the first area 101, the second area 102 may include a notch 104 that is cut according to the presence of the sensor area 524, but in the other area, the second area 102 may be symmetric to the first area 101. In other words, the first area 101 and the second area 102 may each include a portion having a symmetrical shape and a portion having an asymmetrical shape.

Hereinafter, operations of the first housing structure 510 and the second housing structure 520 and the areas of the display 100 according to states (e.g., a flat state and a folded state) of the electronic device 10 will be described.

In an embodiment, when the electronic device 10 is in a flat state (e.g., FIG. 1), the first housing structure 510 and the second housing structure 520 may be arranged to face the same direction while forming an angle of 180 degrees. The surface of the first area 101 of the display 100 and the surface of the second area 102 thereof may face the same direction (e.g., face away from the front surface of the electronic device 10) while forming an angle of 180 degrees. The folding area 103 may form the same plane together with the first area 101 and the second area 102.

In an embodiment, when the electronic device 10 is in a folded state (e.g., FIG. 2), the first housing structure 510 and the second housing structure 520 may be arranged to face each other. The surface of the first area 101 of the display 100 and the surface of the second area 102 thereof may face each other while forming a narrow angle (e.g., an angle between 0 degrees and 10 degrees). At least part of the folding area 103 may form a curved surface having a predetermined curvature.

In an embodiment, when the electronic device 10 is in an intermediate state (e.g., FIG. 2), the first housing structure 510 and the second housing structure 520 may be arranged to have a certain angle therebetween. The surface of the first area 101 of the display 100 and the surface of the second area 102 thereof may form an angle that is greater than that in the folded state and is smaller than that in the flat state. At least part of the folding area 103 may form a curved surface having a predetermined curvature, and the curvature may be smaller than that in the folded state.

Figure 3:
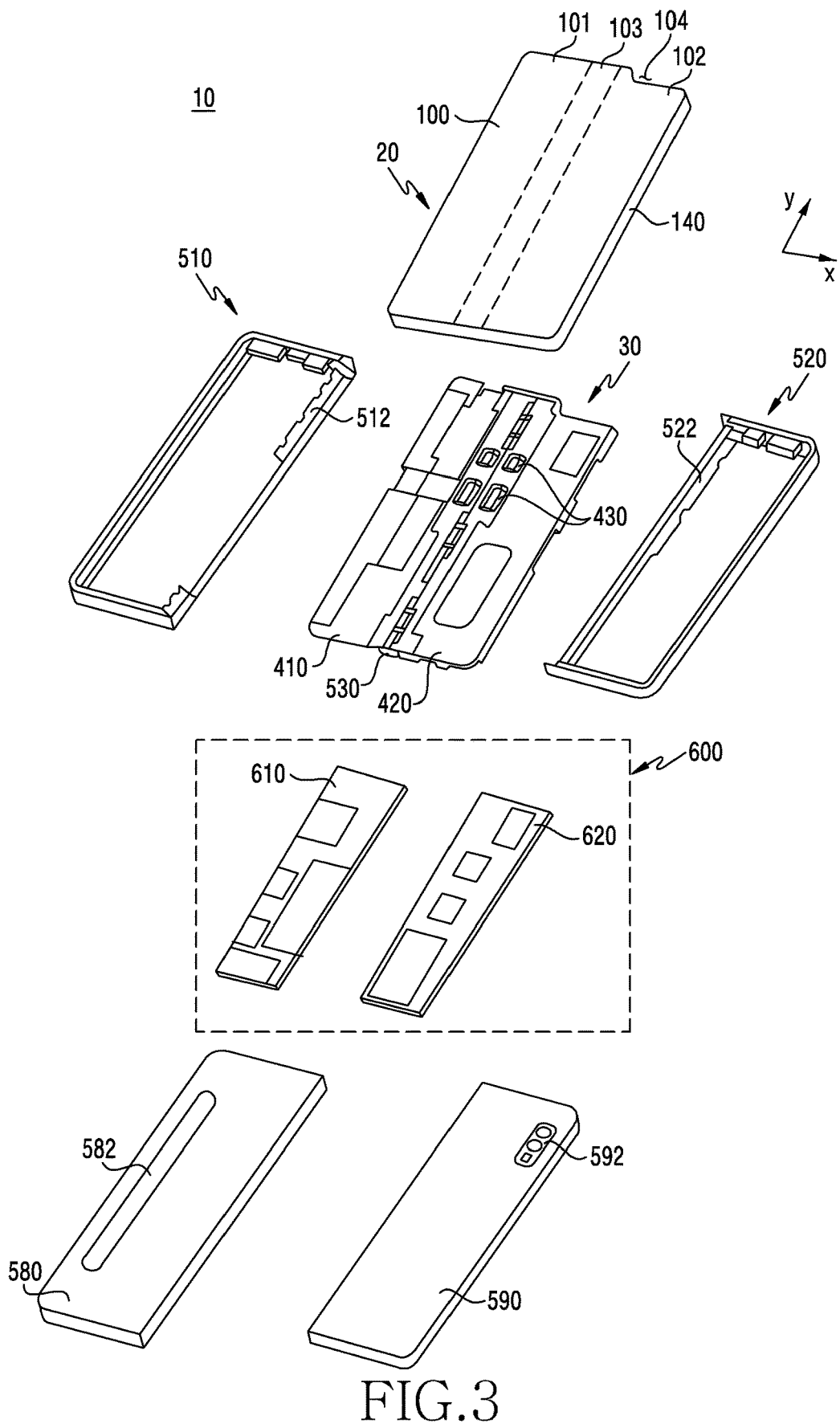
FIG. 3 is an exploded perspective view of an example electronic device according to an embodiment.

FIG. 3 is an exploded perspective view of the example electronic device according to an embodiment.

Referring to FIG. 3, in an embodiment, the electronic device 10 may include a display unit 20, a bracket assembly 30, a substrate 600, the first housing structure 510, the second housing structure 520, the first back cover 580, and the second back cover 590. In this disclosure, the display unit 20 may be referred to as the display module or the display assembly.

The display unit 20 may include the display 100 and at least one plate or layer 140 on which the display 100 is mounted. In an embodiment, the plate 140 may be disposed between the display 100 and the bracket assembly 30. The display 100 may be disposed on at least part of one surface (e.g., an upper surface with respect to FIG. 3) of the plate 140. The plate 140 may be formed in a shape corresponding to the display 100. For example, a partial area of the plate 140 may be formed in a shape corresponding to the notch 104 of the display 100.

The bracket assembly 30 may include a first bracket 410, a second bracket 420, hinge structures 300 disposed between the first bracket 410 and the second bracket 420, the hinge cover 530 that covers the hinge structures 300 when viewed from the outside, and a wiring member 430 (e.g., a flexible printed circuit (FPC)) that traverses the first bracket 410 and the second bracket 420.

In an embodiment, the bracket assembly 30 may be disposed between the plate 140 and the substrate 600. For example, the first bracket 410 may be disposed between the first area 101 of the display 100 and a first substrate 610. The second bracket 420 may be disposed between the second area 102 of the display 100 and a second substrate 620.

In an embodiment, at least a part of the wiring member 430 and the hinge structures 300 may be disposed inside the bracket assembly 30. The wiring member 430 may be arranged in a direction (e.g., the x-axis direction) across the first bracket 410 and the second bracket 420. The wiring member 430 may be arranged in a direction (e.g., the x-axis direction) that is perpendicular to a folding axis (e.g., the y-axis or the folding axis A of FIG. 1) of the folding area 103 of the electronic device 10.

As mentioned above, the substrate 600 may include the first substrate 610 disposed at the first bracket 410 side and the second substrate 620 disposed at the second bracket 420 side. The first substrate 610 and the second substrate 620 may be disposed in a space that is formed by the bracket assembly 30, the first housing structure 510, the second housing structure 520, the first back cover 580, and the second back cover 590. Parts for implementing various functions of the electronic device 10 may be mounted on the first substrate 610 and the second substrate 620.

The first housing structure 510 and the second housing structure 520 may be assembled so as to be coupled to opposite sides of the bracket assembly 30 in the state in which the display unit 20 is coupled to the bracket assembly 30. As will be described herein, the first housing structure 510 and the second housing structure 520 may slide on the opposite sides of the bracket assembly 30 and may be coupled with the bracket assembly 30.

In an embodiment, the first housing structure 510 may include a first rotation support surface 512, and the second housing structure 520 may include a second rotation support surface 522 corresponding to the first rotation support surface 512. The first rotation support surface 512 and the second rotation support surface 522 may include curved surfaces that correspond to curved surfaces included in the hinge cover 530.

In an embodiment, when the electronic device 10 is in a flat state (e.g., the electronic device 10 of FIG. 1), the first rotation support surface 512 and the second rotation support surface 522 may cover the hinge cover 530 such that the hinge cover 530 is not exposed, or is exposed to a minimum, on the rear surface of the electronic device 10. Meanwhile, when the electronic device 10 is in a folded state (e.g., the electronic device 10 of FIG. 2), the first rotation support surface 512 and the second rotation support surface 522 may rotate along the curved surfaces included in the hinge cover 530, such that the hinge cover 530 is exposed on the rear surface of the electronic device 10 to the maximum.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

Figure 4:
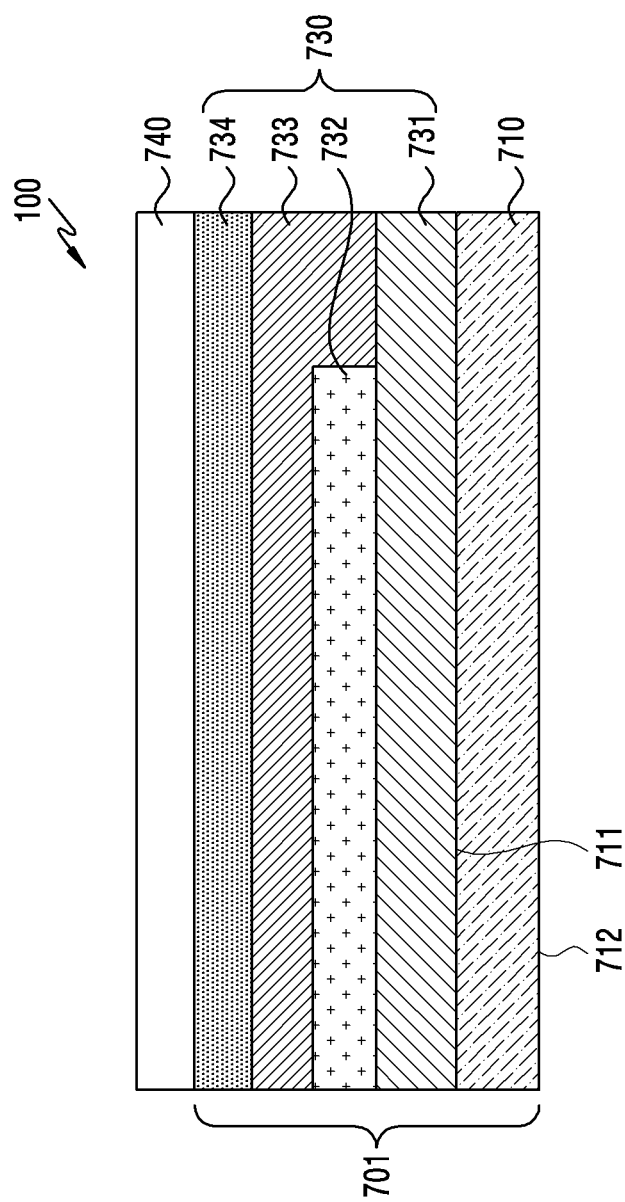
FIG. 4 is a sectional view illustrating an example stacked structure of a display according to an embodiment.

FIG. 4 is a sectional view illustrating an example stacked structure of a display according to an embodiment.

Referring to FIG. 4, in an embodiment, a display 100 may include a display module comprising various layers of the display 701 and a window 740.

According to an embodiment, the display module 701 may include a first substrate 710 and a display panel 730. The substrate 710 may be a base plate that may be the basis of forming the display panel 730, and the display panel 730 may be formed on the substrate 710 through a series of manufacturing processes. The display panel 730 may include a light emitting layer 732 including, for example, a plurality of pixels and a thin film transistor (TFT) 731 configured to control light of each of the pixels.

According to an embodiment, the substrate 710 may be coupled to the display panel 730. According to an embodiment, the substrate 710 may have a shape of a plate including opposite surfaces (first surface 711 and second surface 712), and for example, may include a material such as plastic having flexibility such as, for example, and without limitation, polyimide (PI).

According to an embodiment, the display panel 730 may include a thin-film transistor (TFT) 731 and a light emitting layer 732 including a plurality of pixels controlled by the TFT 731. The TFT 731 may be disposed between the light emitting layer 732 and the substrate 710, and layers of the TFT 731 may be formed on a first surface 711 of the substrate 710 through a series of manufacturing processes including deposition, patterning, etching, etc. For example, an active layer (or semiconductor layer) including a semiconductor material such as polysilicon may be formed on the first surface 711 of the substrate 710, and a gate electrode, a source electrode, and a drain electrode may be formed to drive the active layer. The source electrode may supply electrons, and the drain electrode may receive electrons. The gate electrode may be configured to control transfer of electrons from the source electrode to the drain electrode. The active layer may be electrically connected to the source electrode and the drain electrode, and may become a path (or channel) enabling transfer of electrons in a manner similar to a conductor if a voltage equal to or larger than a predetermined magnitude is applied to the gate electrode.

According to an embodiment, the light emitting layer 732 may include an organic light emitting diode (OLED), and may include an anode, a cathode, and an organic material layer formed on the TFT 731 through, for example, evaporation although the anode, the cathode, and the organic material layer are not illustrated. The anode may be an electrode emitting holes, the cathode may be an electrode emitting electrons, and the organic material layer may be disposed between the anode and the cathode. Due to a reaction of the active layer of the TFT 731, current may flow in the source electrode, the active layer, and the drain electrode, and voltage may be applied to the anode and the cathode of the light emitting layer 732 electrically connected to the TFT 731. Accordingly, electrons emitted from the cathode and holes emitted from the anode may be coupled in the organic material layer, and exciton energy generated from the coupling of the electrons and holes may be released in the form of light from the organic material layer. Such a light emitting layer 732 including an OLED may be referred to, for example, as "an organic light emitting layer". According to various embodiments, the light emitting layer 732 may be replaced with a light emitting element having a structure different from that of an OLED.

According to an embodiment, the TFT 731 may be based, for example, and without limitation, on low-temperature polycrystalline silicon (LTPS). According to an embodiment, the TFT 731 may be based, for example, and without limitation, on amorphous silicon (a-Si).

According to an embodiment, the panel 730 may include an encapsulation part 733 preventing and/or reducing the light emitting layer 732 from being affected by the outside. Since the organic material layer, the anode, or the cathode included in the light emitting layer 732 may react with oxygen or moisture and thus the light emitting layer may lose the light emission properties, the encapsulation part 733 may prevent and/or reduce invasion of oxygen or moisture into the light emitting layer 732, as a seal preventing and/or reducing exposure of the light emitting layer 732. According to an embodiment, the encapsulation part 733 may include, for example, and without limitation, a thin film encapsulation (TFE) layer or part.

According to an embodiment, the display panel 730 may further include an optical layer 734 disposed on the encapsulation part 733. The optical layer 734 may include a phase retardation layer (or phase retarder) and a polarizing layer (or polarizer) disposed on the phase retardation layer. If unpolarized light such as solar light is incident into the panel 730, the unpolarized light passes through the polarizing layer and is then changed into linearly polarized light, and the linearly polarized light passes through the phase retardation layer and may then changed into circularly polarized light depending on the properties of the retardation layer. For example, if unpolarized light passes through a 90-degree polarizing layer, the light is changed into 90-degree linearly polarized light, and if the 90-degree linearly polarized light passes through a 45-degree phase retardation layer (e.g., quarter wave plate), the light is changed into 135-degree circularly polarized light. The 135-degree circularly polarized light has a value between 90° and 180° that are linear polarization axes, and may vibrate while having both X axis and Y axis, that is, the phase of 90° and the phase of 180°. The circularly polarized light does not lie on a particular axis, and may change the axis while vibrating at a uniform amplitude. According to an embodiment, the phase retardation layer may have the properties of a quarter wave retarder ($\lambda/4$ retarder).

According to an embodiment, if solar light is incident into the panel 730, at least a part of the light may be reflected by an electrode, etc. included in the panel 730, and the reflection may cause difficulty for screen recognition. The polarizing layer and the phase retardation layer of the optical layer 734 may prevent and/or reduce light having entered from the outside, from exiting through reflection, so as to increase outdoor visibility. For example, 135-degree circularly polarized light obtained through a change by the phase retardation layer may be reflected by the TFT 731, etc., the reflected 135-degree circularly polarized light is changed into 180-degree linearly polarized light through the phase retardation layer, and the 180-degree linearly polarized light is unable to pass through the 90-degree polarizing layer and then be emitted to the outside. According to an embodiment, a single layer including the polarizing layer and the phase retardation layer that are integrated, may be provided, and the single layer may be defined as "a circular polarizing layer".

According to various embodiments, the display panel 730 may further include other various layers that are not illustrated. For example, the display panel 730 may include a buffer layer including silicon oxide, silicon nitride, etc. and disposed between the TFT 731 and the substrate 710. For example, the display panel 730 may include a protection layer including polymer, etc. and disposed between the buffer layer and the substrate 710.

According to various embodiments, the display module 701 may be various displays based on the TFT 731, and may be, for example, and without limitation, an active matrix organic light emitting diode (AMOLED) display, a passive matrix organic light emitting diode (PMOLED) display, a liquid crystal display (LCD), or the like. According to various embodiments, the display may be disposed on a flexible substrate (e.g. substrate including polyimide (PI)).

According to various embodiments, the window 740 may transfer information to a user by transferring (or passing), to the outside, light generated from the light emitting layer. The window 740 may include a ductile material such as polyimide (PI). According to an embodiment, the window 740 may include a multi-layer structure including various materials. The window 740 may be coupled to the display module 701 to configure a flexible display.

Figure 5A:
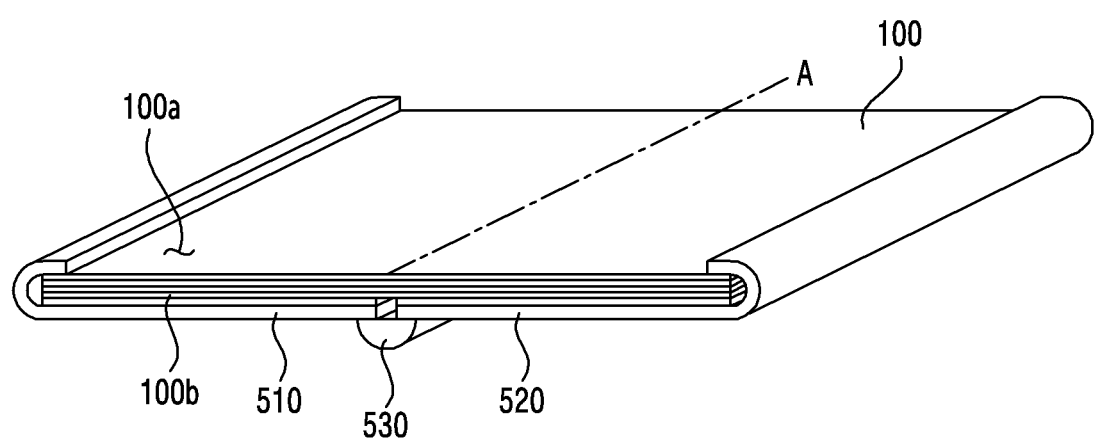
FIG. 5A is a diagram illustrating example layers of a display in an unfolded state of an electronic device according to an embodiment.
Figure 5B:
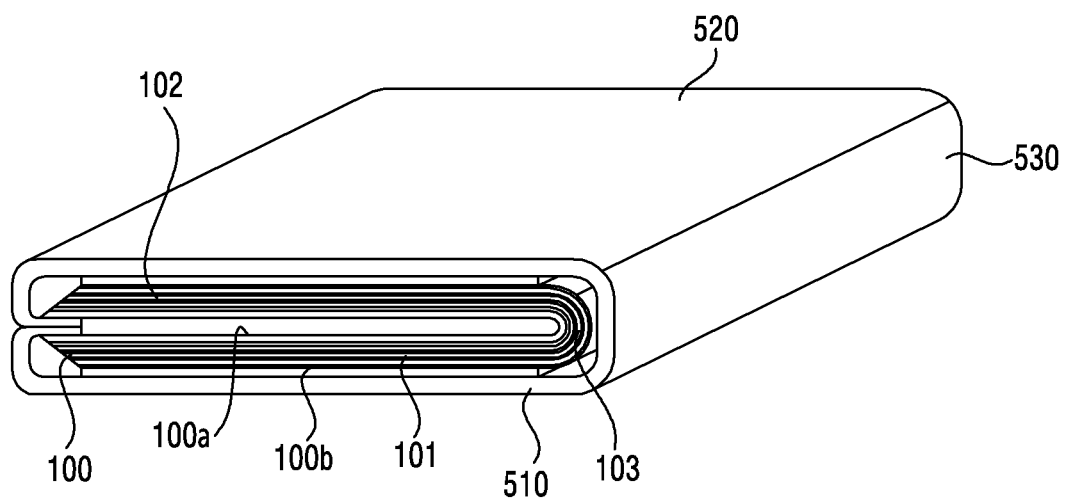
FIG. 5B is a diagram illustrating example layers of a display, which have slipped, in a folded state of an electronic device according to an embodiment.

FIG. 5A is a diagram illustrating example layers of a display in an unfolded state of an electronic device according to an embodiment; and FIG. 5B is a diagram illustrating example layers of a display, which have slipped, in a folded state of an electronic device according to an embodiment.

Referring to FIGS. 5A and 5B, the display 100 may be disposed in a space configured by a first housing structure 510, a second housing structure 520, and a hinge cover 530. The display 100 may include a ductile material and thus may be switched from an unfolded state to a folded state by a hinge structure disposed under the hinge cover 530. The display 100 may be disposed to be supported by a bracket. The bracket may be surrounded by the first housing structure 510 and the second housing structure 520.

According to various embodiments, the display 100 may include a first surface 100a and a second surface 100b opposite to the first surface 100a, and the display 100 may include a plurality of stacked layers. As illustrated in FIG. 5A, if the electronic device (e.g. electronic device 10 in FIG. 1) is in an unfolded state, the layers included in the display 100 may not be deformed. For example, a side surface of a layer configuring the first surface 100a and a side surface of a layer configuring the second surface 100b may coincide with each other.

According to various embodiments, as illustrated in FIG. 5B, if the electronic device is in a folded state, the layers included in the display 100 may be deformed. For example, each of the plurality of layers of the display 100 may slip. If the second surface 100b of the display 100 is fixed by the bracket, the plurality of layers oriented from the second surface 100b to the first surface 100a may slip. The slip direction of the plurality of layers included in the display 100 may be perpendicular to a folding axis (e.g., axis A) on a surface of the display 100.

A layer configuring the first surface 100a among the plurality of layers included in the display 100 may have a curvature of a folding area in a folded state, and the curvature may be larger than those of the other layers. For example, the layer configuring the first surface 100a among the plurality of layers included in the display 100 may have a short radius of curvature, and thus the length of an arc configuring a folding area 103 may be small. The length of a layer configuring the first surface 100a in a first area 101 and a second area 102 extending from the folding area 103, the length being measured in a direction perpendicular to the folding axis (e.g., axis A), may be larger than those of the other layers included in the display 100. A layer configuring the second surface 100b among the plurality of layers included in the display 100 may have a curvature of a folding area in a folded state, and the curvature may be smaller than those of the other layers. For example, the layer configuring the second surface 100b among the plurality of layers included in the display 100 may have a long radius of curvature, and thus the length of an arc configuring the folding area 103 may be large. The length of a layer configuring the second surface 100b in the first area 101 and the second area 102 extending from the folding area 103, the length being measured in a direction perpendicular to the folding axis (e.g., axis A), may be smaller than those of the other layers included in the display 100.

According to various embodiments, the plurality of layers included in the display 100 may have individual arcs having different lengths in the folding area 103, and thus the lengths of the layers in a direction perpendicular to the folding axis in the first area 101 and the second area 102 may be different. Layers configuring the first area 101 and the second area 102 have different lengths, and thus may slip in a direction perpendicular to the folding axis (e.g., axis A).

Figure 6:
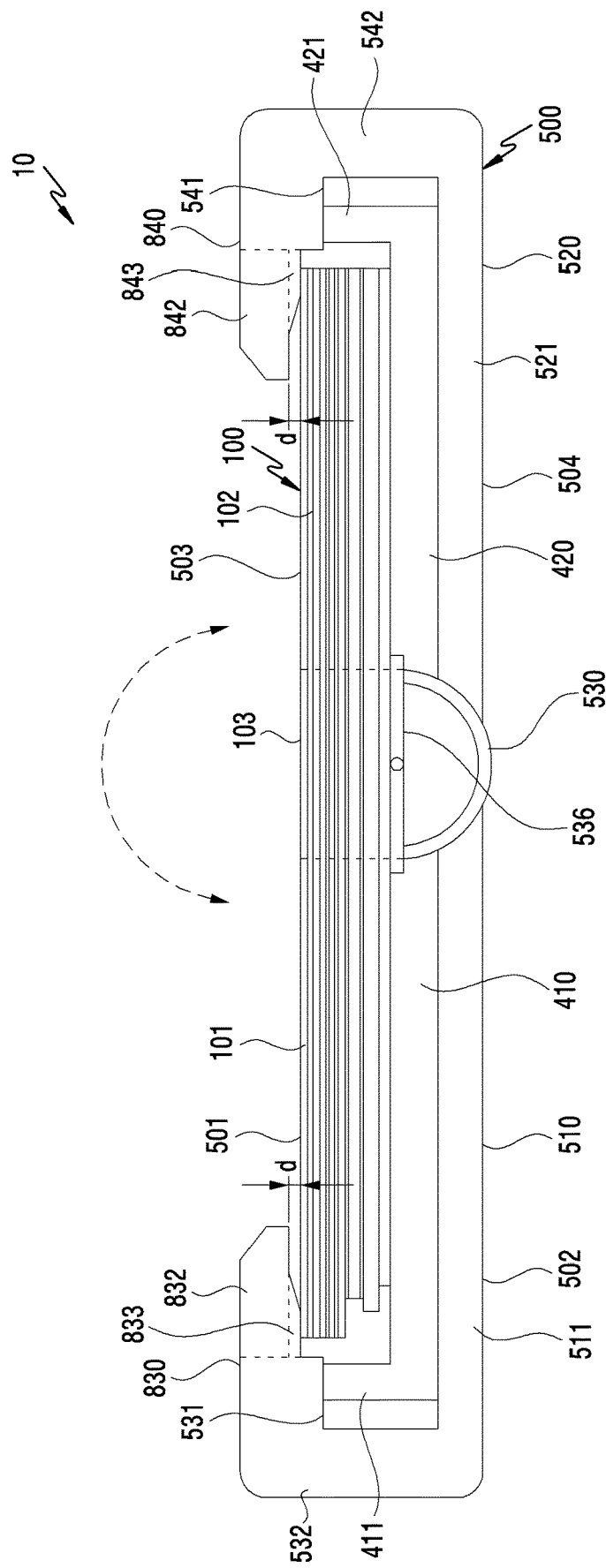
FIG. 6 is a cross sectional view taken along line A-A' in FIG. 1 illustrating an electronic device according to various embodiments.

FIG. 6 is a cross sectional view of the example electronic device 10 taken along line A-A' in FIG. 1 according to various embodiments.

Referring to FIG. 6, an electronic device 10 may include a foldable housing 500 and a display 100. The foldable housing 500 may include a first housing structure 510 and a second housing structure 520 that can be rotated by a rotatable hinge structure 536.

According to various embodiments, the first housing structure 510 may surround a space configured by a first surface 501 oriented in a first direction and a second surface 502 oriented in a second direction opposite to the first direction. The first housing structure 510 may include a first rear plate 511 configuring the second surface 502. A first side surface member 532 extending from the first rear plate 511 in the first direction may surround a part of a space between the first surface 501 and the second surface 502. An electronic component configuring the electronic device 10 may be disposed in a space configured between the first surface 501 and the second surface 502. For example, a part of the display 100, a printed circuit board (not illustrated), or a first bracket 410 may be disposed in a space configured by the first housing structure 510.

The first side surface member 532 may extend along a side surface 411 of the first bracket 410. The first side surface member 532 may extend to be bent and make a surface 531 come in contact with an end of the side surface 411 of the first bracket 410. The first side surface member 532 may include a first bezel 830 that includes a first extension part 832 extending from the surface 531 in contact with the end of the side surface 411 of the first bracket 410, and a first support portion 833 supporting the first extension part 832.

The second housing structure 520 may surround a space configured by a third surface 503 oriented in a third direction and a fourth surface 504 oriented in a fourth direction opposite to the third direction. The second housing structure 520 may include a second rear plate 521 configuring the fourth surface 504. A second side surface member 542 extending from the second rear plate 521 in the third direction may surround a part of a space between the third surface 503 and the fourth surface 504. An electronic component configuring the electronic device 10 may be disposed in a space configured by the first housing structure 510 and a space configured by the second housing structure 520. For example, the display 100 or a printed circuit board may be disposed in a space configured by the first housing structure 510 and the second housing structure 520. A second bracket 420 may be disposed in a space configured by the second housing structure 520.

The second side surface member 542 may extend along a side surface 421 of the second bracket 420. The second side surface member 542 may extend to be bent and make a surface 541 come in contact with an end of the side surface 421 of the second bracket 420. The second side surface member 542 may include a second bezel 840 that includes a second extension part 842 extending from the surface 541 in contact with the end of the side surface 421 of the second bracket 420, and a second support portion 843 supporting the second extension part 842.

According to an embodiment, the first bracket 410 may be disposed on the first rear plate 511. The end of the side surface 411 of the first bracket 410 may be in contact with the side surface member 532 of the first housing structure 510 and may be fixed by the first rear plate 511. The first bracket 410 may be coupled to the first rear plate 511 and moved together therewith. The first bracket 410 may be coupled to the hinge structure 536 and may be rotated by means of the hinge structure 536. The first rear plate 511 may be rotated together with the first bracket 410.

The second bracket 420 may be disposed on the second rear plate 521. The end of the side surface 421 of the second bracket 420 may be in contact with the side surface member 542 of the second housing structure 520 and may be fixed by the second rear plate 521. The second bracket 420 may be coupled to the second rear plate 521 and moved together therewith. The second bracket 420 may be coupled to the hinge structure 536 and may be rotated by means of the hinge structure 536. The second rear plate 511 may be rotated together with the second bracket 410.

The display 100 may be disposed over the first bracket 410 and the second bracket 420. For example, the first area 101 of the display 100 may be supported by the first bracket 410, and the second area 102 of the display 100 may be supported by the second bracket 420. The folding area 103 of the display 100 may be disposed at a location corresponding to the hinge structure 536 or the hinge cover 530. For example, the folding area 103 may be disposed at a connection portion between the first bracket 410 and the second bracket 420, and may be supported by the first bracket 410 and the second bracket 420. A part of an edge of the display 100 may be in contact with the first support portion 833 of the first bezel 830 and the second support portion 843 of the second bezel 840. The first support portion 833 of the first bezel 830 and the second support portion 843 of the second bezel 840 may occupy a gap (d) between the display 100 and the first bezel 830 or the second bezel 840. The electronic device 10 is configured such that the first support portion 833 of the first bezel 830 or the second support portion 843 of the second bezel 840 is in contact with the display 100, and thus can prevent foreign material from being introduced into the foldable housing 500.

According to an embodiment, if the electronic device 10 is in a folded state by rotating about the hinge structure 536, the first housing structure 510 and the second housing structure 520 may be arranged to face each other. For example, the first surface 501 of the foldable housing 500 may be rotated by the hinge structure 536 and then may face the third surface 503.

Figure 7:
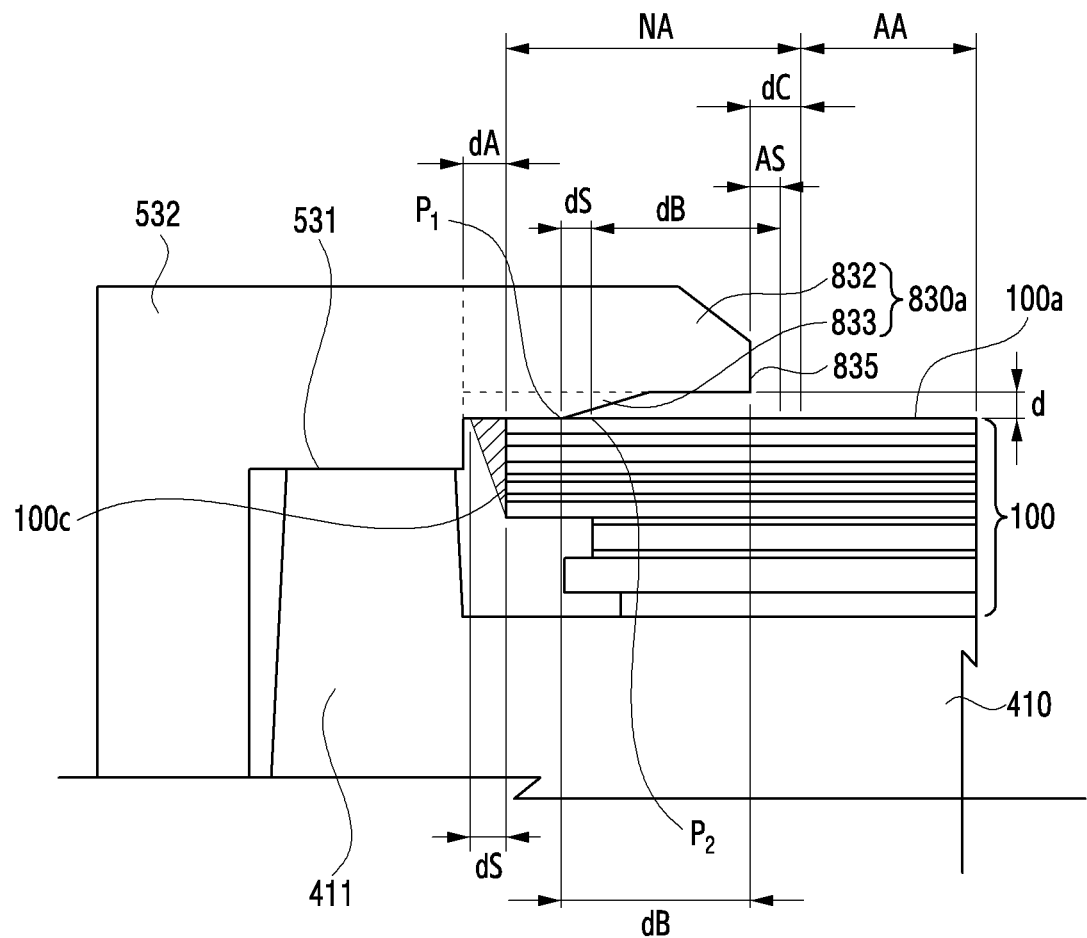
FIG. 7 is a cross sectional view taken along line B-B' in FIG. 1 illustrating an electronic device according to various embodiments.
Figure 8:
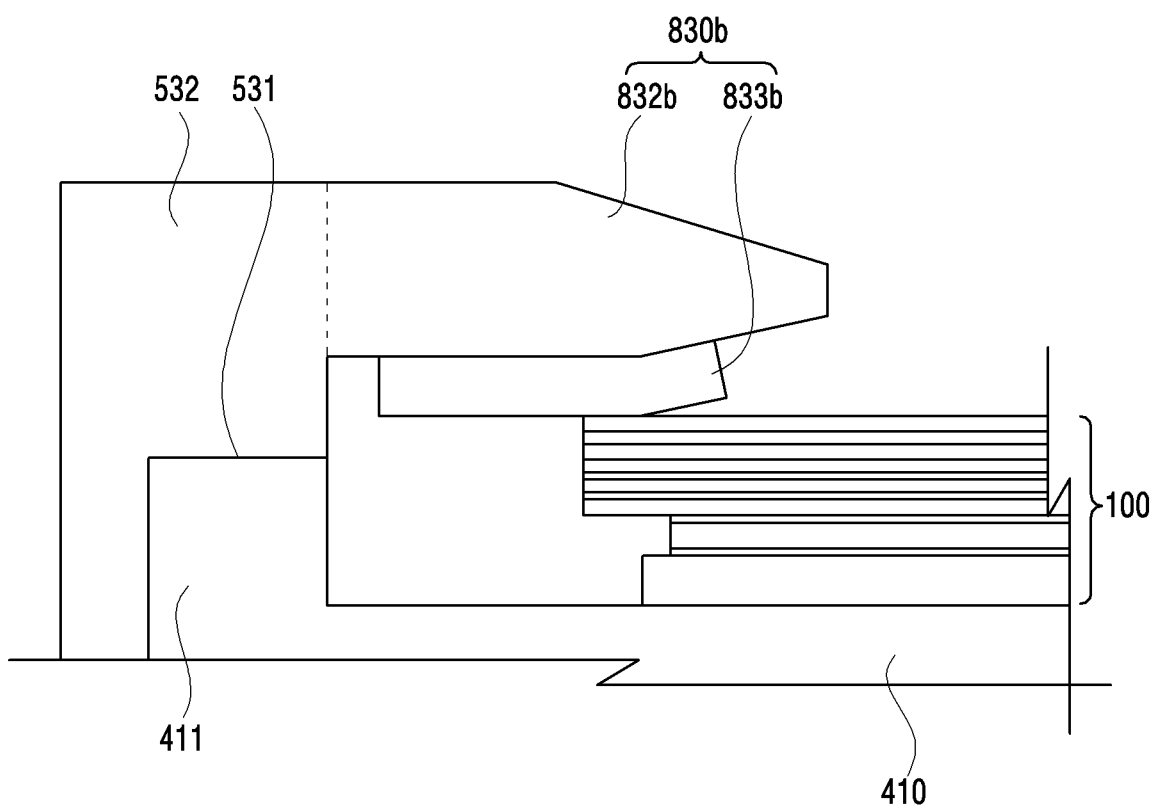
FIG. 8 is a cross sectional view taken along line B-B' in FIG. 1 illustrating an electronic device according to various embodiments.
Figure 9:
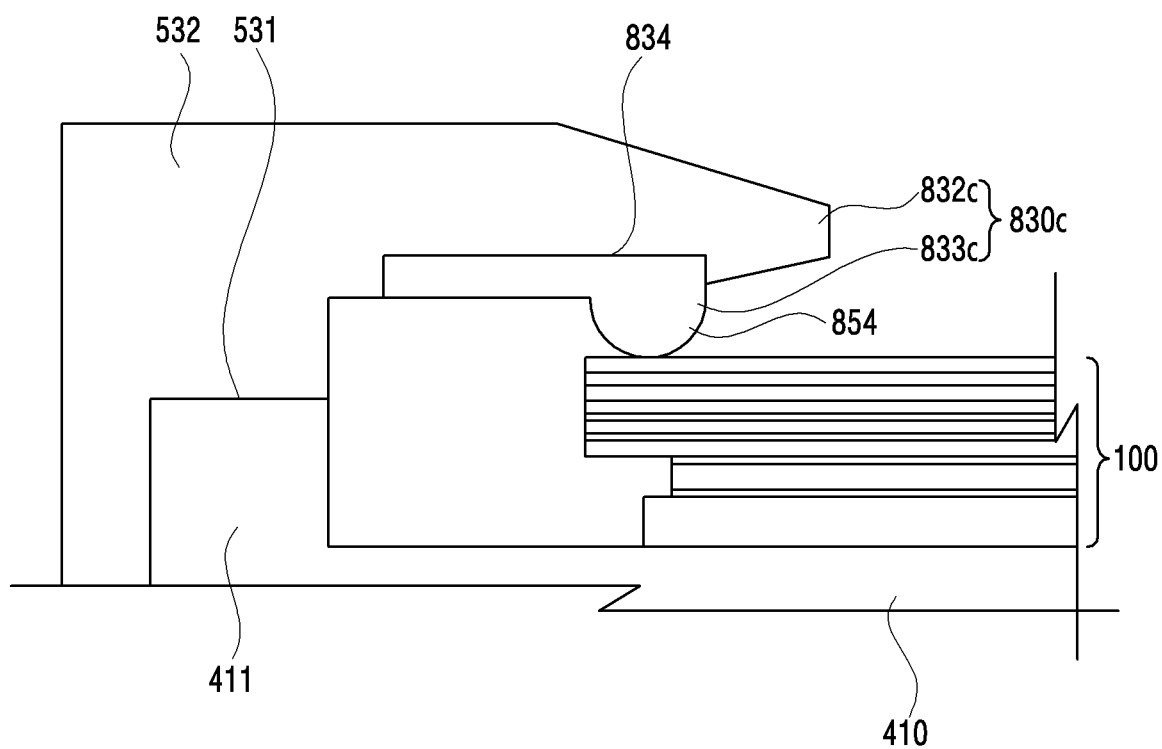
FIG. 9 is a cross sectional view taken along line B-B' in FIG. 1 illustrating an electronic device according to various embodiments.
Figure 10:
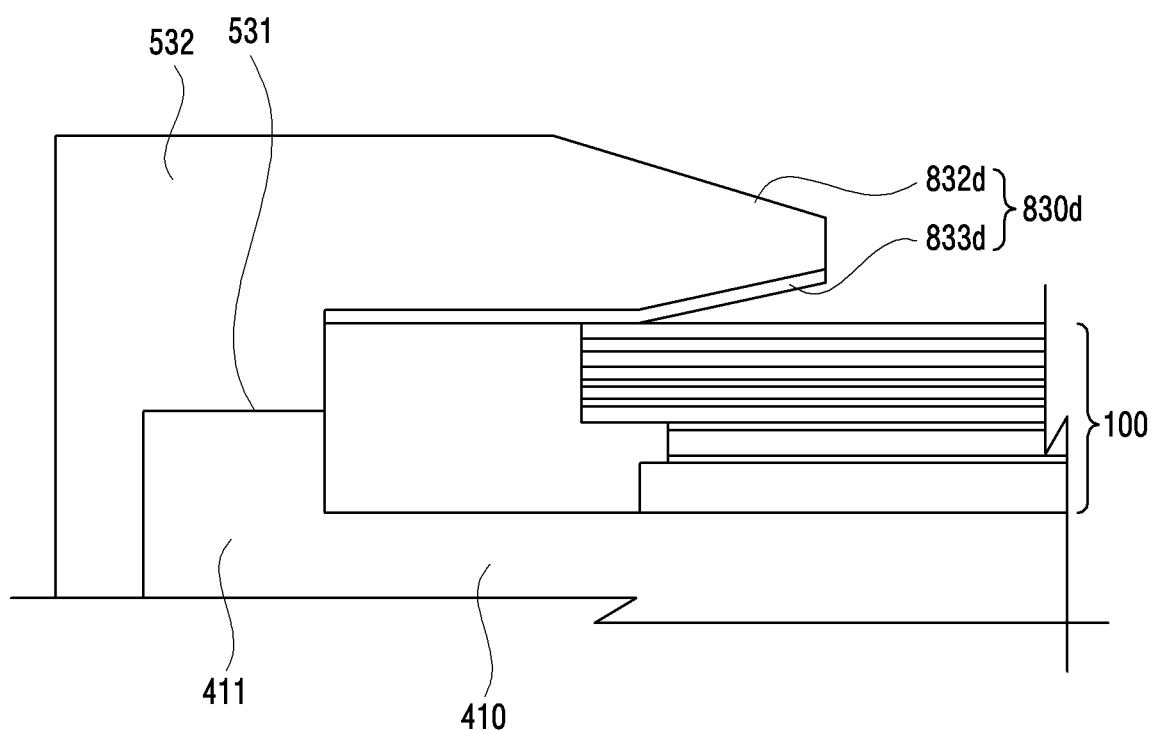
FIG. 10 is a cross sectional view taken along line B-B' in FIG. 1 illustrating an electronic device according to various embodiments.

FIG. 7 is a cross sectional view taken along line B-B' in FIG. 1 illustrating an electronic device according to various embodiments; FIG. 8 is a cross sectional view taken along line B-B' in FIG. 1 illustrating an electronic device according to various embodiments; FIG. 9 is a cross sectional view taken along line B-B' in FIG. 1 illustrating an electronic device according to various embodiments; and FIG. 10 is a cross sectional view taken along line B-B' in FIG. 1 illustrating an electronic device according to various embodiments.

Referring to FIG. 7, a first bezel 830a may include a first extension part 832 and a first support portion 833.

According to an embodiment, the first extension part 832 may extend from the first side surface member 532 toward the edge of the display 100. The first extension part 832 may be spaced a predetermined distance (d) apart from the display 100. The display 100 and the first extension part 832 may be arranged to partially overlap each other. When the first surface 501 (see, e.g., FIG. 6), at the side of which a user can see the display 100, is viewed, a part of the edge of the display 100 may be hidden by the first extension part 832 of the first bezel 830a. The first extension part 832 may extend from and be integrated with the first side surface member 532. According to various embodiments, the first extension part 832 may be manufactured as a separate component. A separately manufactured first extension part 832 may be coupled to the first side surface member 532. For example, the first extension part 832 may be coupled to the first side surface member 532 through bonding or fusing, and the first extension part 832 may be coupled to the first side surface member 532 through double injection.

According to an embodiment, the first support portion 833 may protrude from the first extension part 832 toward the edge of the display 100 to be in contact with a part of the edge of the display 100. For example, the first support portion 833 may be disposed between the first extension part 832 and the edge of the display 100 to support the first extension part 832.

After the manufacture of the electronic device 10, the first bezel 830a may naturally sag by the use of the device, or may sag by an external force. If the first bezel 830a has sagged, a distal end 835 of the first bezel 830a may come into contact with the display 100, and a corresponding contact portion of the display 100 may be damaged. According to an embodiment, the display 100 including the plurality of layers may slip by folding of the electronic device 10, and thus the display 100 may have damage (e.g. scratch) due to the slip at a contact portion with the first bezel 830a. Damage having occurred on the surface of the display 100 in a folded state by a slip may be recognized in an unfolded state from the outside.

According to various embodiments, in order to reduce damage that may occur on the surface of the display 100 by a slip of the display 100, and prevent and/or reduce an occurrence of the end of a bezel from coming into contact with the surface of the display 100 due to sagging of the bezel, the first bezel 830a may include the first surface part 833 protruding from the first extension part 832. The first support portion 833 may extend from a point where the first extension part 832 and the side surface member 532 meet, and may be in contact with a part of the edge of the display 100. The first support portion 833 may not be disposed on an area where an end 835 of the first extension part 832 is positioned, and may keep the first extension part 832 and the surface of the display 100 spaced apart from each other. The first support portion 833 may be in contact with the display 100 in a partial area of the first bezel 830a, to remove a gap between the display 100 and the bezel 830a in the partial area. Foreign material or moisture may be introduced through a separation space between the first extension part 832 and the panel of the display 100. The electronic device 10 may prevent and/or reduce further introduction of foreign material or moisture in an area where the display 100 and the first support portion 833 contact.

According to various embodiments, in an unfolded state of the electronic device 10, a side surface 100c of the display 100 may be spaced a first distance (dA) apart from the side surface 411 of the first bracket 410 or the side surface member 532. The first distance (dA) may be larger than a slip distance (dS). The slip distance (dS) may be the longest distance in a range in which a slip of the side surface 100c of the plurality of layers included in the display 100 occurs.

According to an embodiment, the first support portion 833 may be in contact with the surface of the display 100 at a point P1 spaced at least a second distance (dB) apart from the end 835 of the first extension part 832 in a direction toward the side surface member 532. For example, the closest distance from an area where the first support portion 833 and the surface of the display 100 contact, to the end 835 of the first extension part 832 may be the second distance (dB). For another example, the first bezel 830a may extend, by the second distance (dB), from an area where the first support portion 833 and the surface of the edge of the display 100 meet, and an extended part may be spaced a predetermined distance (d) from the surface of the display 100. A gap between the surface of the display 100 and the first bezel 830a may prevent the first bezel 830a from directly contacting the surface of the display 100 and prevent damage to the surface of the display 100 due to a contact of the first bezel 830a.

According to various embodiments, the display 100 may include an active area (AA) and a nonactive area (NA). The active area (AA) of the display 100 may substantially emit light to the outside by a pixel, and the nonactive area (NA) may not have a pixel, or may not emit light to the outside.

According to various embodiments, in an unfolded state of the electronic device, the end 835 of the first bezel 830 may be disposed to be spaced a third distance (dC) apart from the active area (AA) of the display 100. In an unfolded state of the electronic device 10, the first bezel 830 may not cover the active area (AA) from the outside, and the third distance (dC) may be larger than the slip distance (dS) in order to prevent damage to the active area (AA) due to an unintended contact with the display 100 by the first bezel 830 in a folded state.

According to various embodiments, in an unfolded state of the electronic device 10, the side surface 100c of the display 100 may be spaced by the first distance (dA). If the electronic device 10 is switched into a folded state, the side surface 100c of the display 100 may slip toward the side surface member 532 by the slip distance (dS). The first distance (dA) is larger than the slip distance (dS) and thus can prevent the side surface 100c of the display 100 from coming into contact with the side surface member 532 and then be damaged. Each of the layers of the side surface 100c of the display 100 may be exposed, but another side surface may include a flexible printed circuit board (e.g. chip-on-film (COF)) connected to a display drive circuit (display drive integrated circuit (DDI)). If there is an additional component extending from the side surface 100c, the first distance (dA) from the display side surface 100c to the side surface member 532 or the side surface 411 of the first bracket 410 may be determined in consideration of the size of the component.

In an unfolded state of the electronic device 10, the point P1 of the first support portion 833 contacting the surface of the display 100 may be disposed to be spaced the second distance (dB) apart from the end 835 of the first bezel 830a. If the electronic device 10 is switched into a folded state, the display 100 may slip, and the point P1 of the first support portion 833 contacting the surface of the display 100 may be moved by the slip distance (dS) from a point P2.

According to various embodiments, in a folded state of the electronic device 10, an area where the first bezel 830a and the display 100 overlap may be increased due to a slip of the display 100 by an area (AS). For example, the area (AS) of the display 100 may be an area by which the display further enters under the first bezel 830a by a slip of the display 100, and may correspond to the slip distance (dS). The area (AS) may be not recognized from the outside due to the first bezel 830a in a folded state of the electronic device 10, but the area may be recognized from the outside in an unfolded state of the electronic device 10. If the second distance (dB) is smaller than the slip distance (dS), the point P2 of the surface of the display 100 contacting the first support portion 833 may be recognized from the outside in an unfolded state of the electronic device 10. Even if the material of the first support portion 833 has a surface hardness smaller than that of the display 100, there may be a fine scratch. Therefore, the second distance (dB) may be larger than the slip distance (dS) so that the point P2 of the surface of the display 100 contacting the first support portion 833 is hidden by the first bezel 830a.

According to various embodiments, in a folded state of the electronic device 10, a distance (dC) from the end 835 of the first bezel 830 to the active area (AA) may be smaller, as much as the slip distance (dS), than that of an unfolded state toward the active area (AA) with reference to the display 100. The first bezel 830 of the electronic device 10 according to various embodiments is spaced a predetermined distance (d) apart from the surface of the display 100, but the first bezel may temporarily contact the surface of the display 100 by an external force or deformation. If the third distance (dC) is smaller than the slip distance, damage due to a contact with the surface of the display 100 may occur. For example, in a folded state of the electronic device 10, the end 835 of the first bezel 830 may be closer, as much as the slip distance (dS), to the active area (AA), than in an unfolded state. A position at which the surface of the display 100 and the first bezel 830 can contact may be also closer, as much as the slip distance, to the active area (AA). If the third distance (dC) is smaller than the slip distance (dS), the surface of the active area (AA) of the display 100 may be also damaged. If the third distance (dC) is larger than the slip distance (dS), the surface of the active area (AA) of the display 100, which substantially displays information through the display 100, may be protected from being damaged.

The electronic device 10 according to various embodiments has been described as an in-folding type in which the first surface and the third surface of the display 100 face each other in a folded state, but the electronic device 10 may be an out-folding type electronic device, the outer appearance of which is configured by the first surface and the third surface of the display 100 in a folded state.

As described above, in a folded state of the electronic device 10 having an in-folding type, the slip distance of a layer disposed close to the first surface or the third surface may be large. On the other hand, in a folded state of the electronic device 10 having an out-folding type, the slip distance of a layer disposed far away from the first surface or the third surface may be large.

Referring to FIGS. 7, 8, 9, and 10, the various support portions may have various shapes.

According to an embodiment, as illustrated in FIG. 7, the first bezel 830a may include the first extension part 832 and the first support portion 833 protruding from the first extension part 832, and the first extension part 832 and the first support portion 833 may be integrally configured.

According to various embodiments, as illustrated in FIG. 8, a first bezel 830b may include a first extension part 832b and a first support portion 833b disposed along a part of a surface of the first extension part 832b, which is oriented toward the display 100. The first extension part 832b may have an inclined surface oriented toward the display 100. The support portion 833b may be disposed around a point (e.g. point P1 in FIG. 7) of the first bezel 830b contacting the surface of the display 100. The first support portion 833b may include a material, such as sponge, having a hardness less than a hardness of the surface of the display 100. The first support portion 833b may be disposed between the surface of the display and a structure while being in contact therewith or being compressed. Foreign material introduced through a gap between the surface of the display 100 and the first bezel 830b may be blocked by the first support portion 833b compressed between the surface of the display 100 and the structure. The first support portion 833b may be inclined to allow a slip of the display 100. The surface of the first support portion 833b may include a material, such as, for example, and without limitation, Teflon tape, PET, a polyurethane (PU) sheet, or the like, having small coefficient of friction, to facilitate a slip of the display 100. According to various embodiments, the first distance (e.g. first distance (dA) in FIG. 7), the second distance (e.g. second distance (dB) in FIG. 7), and the third distance (e.g. third distance (dC) in FIG. 7) described with reference to FIG. 7 may be applied to the first bezel 830b in FIG. 8 in the same way. For example, a first distance (dA) from the side surface of the display panel 100 to a first side surface member or the side surface 411 of the first bracket 410 may be larger than a slip distance (e.g. slip distance (dS) in FIG. 7). A second distance (dB) from a point where the surface of the display 100 and the first support portion 833b contact, to an end of the first extension part 832b may be larger than the slip distance (dS). A third distance (dC) from the end of the first extension part 832b to the active area of the display 100 may be larger than the slip distance (dS).

According to various embodiments, a first bezel 830c in FIG. 9 may include a first support portion 833c disposed in a first extension part 832c. The first support portion 833c may be attached to a seating groove 834 disposed on the first extension part 832c. The first support portion 833c may include a material, such as, for example, and without limitation, silicone, urethane, liquid silicone rubber (LSR), or the like, having elasticity. The first support portion 833c may be configured in a method of bonding the first support portion 833c formed through double injection, to the seating groove 834 of the first extension part 832c. A support portion comprising liquid silicone rubber may be formed, for example, through liquid injection molding (LIM) of heating and hardening liquid rubber.

The first support portion 833c may be received in the seating groove 834 disposed on the first extension part 832c, and may include a protrusion part 854 at least partially protruding toward the surface of the display. The protrusion part 854 may be in contact with at least a part of the surface of the display 100, and may keep a gap with the first bezel 830c including the first extension part 832c. The protrusion part 854 may prevent and/or reduce damage to the surface of the display 100 by keeping a gap with the first bezel 830c, and may prevent and/or reduce introduction of foreign material or moisture through a separation space by contacting the surface of the display 100. The protrusion part 854 may facilitate occurrence of a slip and prevent and/or reduce damage to the surface of the display 100 by minimizing and/or reducing a contact area with the surface of the display 100.

According to various embodiments, the first distance (e.g. first distance (dA) in FIG. 7), the second distance (e.g. second distance (dB) in FIG. 7), and the third distance (e.g. third distance (dC) in FIG. 7) described with reference to FIG. 7 may be applied to the first bezel 830c in FIG. 9 in the same way. For example, a first distance (dA) from the side surface of the display 100 to the first side surface member 532 or the side surface 411 of the first bracket 410 may be larger than a slip distance (e.g. slip distance (dS) in FIG. 7). A second distance (dB) from a point where the surface of the display 100 and the first support portion 833c contact, to an end of the first extension part 832c may be larger than the slip distance (dS). A third distance (dC) from the end of the first extension part 832c to the active area of the display 100 may be larger than the slip distance (dS).

Referring to FIG. 10, a first bezel 830d may include a first extension part 832d and a coating layer 833d. The first extension part 832d may include an area spaced apart from the surface of the display 100 and an area in contact with the surface of the display 100. The area spaced apart from the surface of the display 100 may extend from an end of the first extension part 832d toward the edge of the display 100. The area in contact with the surface of the display 100 may be configured in an edge area of the display 100. The first bezel 830d may include an extension part and a support portion as the first bezel 830a in FIG. 7. The support portion of the first bezel 830d may be configured to fit smoothly with the surface of the extension part. The coating layer 833d may be disposed along the surface of the support portion and the surface of the extension part of the first bezel 830d.

As described above, in the electronic device according to various embodiments, the coating layer 833d is disposed on a surface of the first bezel 830d, which is oriented toward the surface of the display 100, so that the display 100 can easily slip. The coating layer 833d may include a material, such as, for example, and without limitation, Teflon coating, PET, a PU sheet, or the like, having low coefficient of friction. The first extension part 832d of the first bezel 830d may occupy a gap between the first bezel 830d and the surface of the display 100. The coating layer 833d may prevent and/or reduce foreign material or moisture from being introduced through a separation space between the first bezel 830d and the display 100.

According to various embodiments, the first distance (e.g. first distance (dA) in FIG. 7), the second distance (e.g. second distance (dB) in FIG. 7), and the third distance (e.g. third distance (dC) in FIG. 7) described with reference to FIG. 7 may be applied to the first bezel 830d in FIG. 10 in the same way. For example, a first distance (dA) from the side surface of the display panel 100 to the first side surface member 532 or the side surface 411 of the first bracket 410 may be larger than a slip distance (e.g. slip distance (dS) in FIG. 7). A second distance (dB) from a point where the surface of the display 100 and the coating layer 833d applied to the first extension part 832d contact, to an end of the first extension part 832d may be larger than the slip distance (dS). A third distance (dC) from the end of the first extension part 832d to the active area of the display 100 may be larger than the slip distance (dS).

In relation to an electronic device according to various embodiments, a structure of a first support portion (e.g. first support portion 833 in FIG. 6) designed to fill a gap between a first bezel (e.g. bezel 830 in FIG. 6) and the surface of a display 100 has been described, but a second bezel (e.g. second bezel 840 in FIG. 6) may also include a first support portion like the first bezel.

An electronic device 10 according to various embodiments includes a first support portion 833 and a second support portion 843 and thus can prevent and/or reduce a first bezel (e.g. first bezel 830 in FIG. 6) and a second bezel (e.g. second bezel 840 of FIG. 6) from coming into contact with the surface of a display 100. The first support portion 833 and the second support portion 843 can prevent and/or reduce introduction of foreign material or moisture through a separation space, by contacting the surface of the display 100 and the first bezel and the second bezel. The first support portion 833 and the second support portion 843 may include a material having a low coefficient of friction, and thus can prevent and/or reduce damage to the surface of the display 100 at the time of shear behavior due to a slip of the display 100.

An electronic device (e.g. electronic device 10 in FIG. 1) according to various example embodiments as described above may include: a foldable housing (e.g. foldable housing 500 in FIG. 1) including a hinge (e.g. hinge structure 536 in FIG. 6), a first housing (e.g. first housing structure 510 in FIG. 1) connected to the hinge and including a first surface (e.g. first surface 501 in FIG. 6) oriented in a first direction and a second surface (e.g. second surface 502 in FIG. 6) oriented in a second direction opposite the first direction, a second housing (e.g. second housing structure 520 in FIG. 1) connected to the hinge and including a third surface (e.g. third surface 503 in FIG. 6) oriented in a third direction and a fourth surface (e.g. fourth surface 504 in FIG. 6) oriented in a fourth direction opposite the third direction, wherein the second housing is configured to be folded on the first housing about the hinge, and side surfaces (e.g. first side surface member 532 or second side surface member 542 in FIG. 6) surrounding at least a part of a space between the first surface and the second surface and at least a part of a space between the third surface and the fourth surface; and a display (e.g. display 100 in FIG. 1) having ductility and extending from the first surface to the third surface to configure the first surface and the third surface, wherein the foldable housing is disposed along an edge of the display and includes bezels (e.g. first bezel 830 in FIG. 6) extending from the side surfaces to an active area of the display, wherein the bezels include, in an area configuring the first surface and the third surface of the foldable housing, extensions (e.g. first extension part 832 or second extension part 842 in FIG. 6) spaced apart from edge portions of the display, and support portions (e.g. first support portion 833 or second support portion 843 in FIG. 6) disposed between the edge of the display and the extensions to be in contact with the edge portions of the display.

According to various example embodiments, in an unfolded state of the electronic device, the side surfaces may be spaced apart from side surfaces of the display by a first distance (e.g. first distance (dA) in FIG. 7), and the first distance may be greater than a slip distance (e.g. slip distance (dS) in FIG. 7) of the display.

According to various example embodiments, the support portions may be in contact with the display at least a second distance (e.g. second distance (dB) in FIG. 7) from ends of the extensions toward the side surfaces, and the second distance may be greater than the slip distance of the display.

According to various example embodiments, the support portions may protrude toward a surface of the display with reference to the extensions.

According to various example embodiments, edges of the extensions may be spaced apart from an edge of the active area (e.g. active area (AA) in FIG. 7) of the display.

According to various example embodiments, the extensions may maintain a gap with the display in the first direction in an unfolded state or a folded state of the electronic device.

According to various example embodiments, the extensions may be integrally configured with the support portions.

According to various example embodiments, the support portions may be disposed along parts of surfaces of the extensions which face the display.

According to various example embodiments, a surface of each of the support portions may include a material having a hardness less than a hardness of a surface of the display.

According to various example embodiments, parts of the surfaces of the extensions may be inclined with reference to a surface of the display.

According to various example embodiments, each of the support portions may include Teflon tape, PET, a PU sheet, or sponge.

According to various example embodiments, the support portions may comprise a material different from a material of the extensions, and each of the support portions may include a material having a hardness less than a hardness of a surface of the display.

According to various example embodiments, each of the support portions may be double injection molded or bonded.

According to various example embodiments, surfaces of the support portions may be configured to fit smoothly with surfaces of the extensions, and the electronic device may include coating layers (e.g. coating layer 833*d* in FIG. 10) disposed on the surfaces of an extension and a corresponding support portion, and the surfaces of other extensions and the other support portions.

An electronic device (e.g. electronic device 10 in FIG. 6) according to various example embodiments may include: a hinge (e.g. hinge structure 531 in FIG. 6); a first housing (e.g. first housing structure 510) connected to the hinge and including a first surface (e.g. first surface 501 in FIG. 6) oriented in a first direction and a second surface (e.g. second surface 502 in FIG. 6) oriented in a second direction opposite the first direction; a second housing (e.g. second housing structure 520 in FIG. 6) connected to the hinge, and including a third surface (e.g. third surface 503 in FIG. 6) oriented in a third direction and a fourth surface (e.g. fourth surface 504 in FIG. 6) oriented in a fourth direction opposite the third direction, wherein the second housing is configured to be folded on the first housing about the hinge; a flexible display (e.g. display 100 of FIG. 6) extending from the first surface to the third surface; a first bracket (e.g. first bracket 410 in FIG. 6) disposed in a space between the first surface and the second surface supporting a portion of the flexible display; a second bracket (e.g. second bracket 420 in FIG. 6) disposed in a space between the third surface and the fourth surface supporting a remaining portion of the flexible display; and a bezel (e.g. first bezel 830 or second bezel 840 in FIG. 6) including an extension (e.g. first extension part 832 in FIG. 6 or second extension part 842 in FIG. 6) in contact with a portion of the first bracket or a portion of the second bracket and extending toward an edge portion of the display, and a support portion (e.g. first support portion 833 or second support portion 843 in FIG. 6) being in contact with the edge portion of the display.

According to various example embodiments, in an unfolded state of the electronic device, side surfaces of the brackets may be spaced apart from side surfaces of the display by a first distance (e.g. first distance (dA) in FIG. 7), and the first distance may be greater than a slip distance (e.g. slip distance (dS) in FIG. 7) of the display.

According to various example embodiments, the support portion may be in contact with the display at least a second distance (e.g. second distance (dB) in FIG. 7) from an end of the extension part toward a side surface member, and the second distance may be greater than the slip distance of the display.

According to various example embodiments, the extension may maintain a gap with the display in the first direction in an unfolded state or a folded state of the electronic device.

According to various example embodiments, the support portion may protrude toward a surface of the display.

According to various example embodiments, a surface of the support portion may be configured to fit with a surface of the extension, and the electronic device may include a coating layer (e.g. coating layer 833*d* in FIG. 10) disposed on the surface of the extension and the surface of the support portion.

In the various example embodiments of the disclosure described above, the elements included in the disclosure have been represented singular or plural in accordance with the example embodiments shown. It should be understood, however, that the singular or plural representations are selected appropriately according to the situations presented for the convenience of description, and the disclosure is not limited to the singular or plural elements, and may include a plurality of elements even if they are expressed.

While the disclosure has been illustrated and described with reference to various example embodiments, it is to be understood that the example embodiments are intended to be illustrative, not limiting. It will be understood by one of ordinary skill in the art that various changes in form and detail may be made without departing from the spirit and scope of the disclosure, including the appended claims and their equivalents.

What is claimed is:

1. An electronic device comprising:
   a hinge;
   a foldable housing; and
   a display,
   wherein the foldable housing comprises:
   a first housing connected to the hinge and including a first surface oriented in a first direction and a second surface oriented in a second direction opposite the first direction;
   a second housing connected to the hinge and including a third surface oriented in a third direction and a fourth surface oriented in a fourth direction opposite the third direction, wherein the second housing is configured to be folded toward the first housing about the hinge; and
   side members having outer side surfaces exposed to an outside of the electronic device and inner side surfaces, the inner side surfaces surrounding at least a part of a space between the first surface and the second surface, and surrounding at least a part of a space between the third surface and the fourth surface, and
   wherein the display has ductility and extends from the first surface to the third surface to configure the first surface and the third surface,
   wherein the foldable housing is disposed along an edge of the display and includes bezels extending from respective side members of the foldable housings to an active area of the display,
   wherein the bezels include, in an area of the first surface and the third surface of the foldable housing, extensions spaced apart from a surface of edge portions of the display, and support portions disposed between the edges portions of the display and the extensions,
   wherein the edge portions of the display are overlapped with the extensions and the support portions,
      wherein side surfaces of the display are configured to be slipped toward the respective inner side surfaces of the side members when the electronic device is folded, and
   wherein spaces for the slipping of the side surfaces of the display are formed between the side surfaces of the display and the respective inner side surfaces of the side members.

2. The electronic device of claim 1, wherein, in an unfolded state of the electronic device, the side members are spaced apart from respective side surfaces of the display by a first distance, and the first distance is greater than a slip distance of the display.

3. The electronic device of claim 1,
   wherein the support portions are in contact with the display at least a second distance from ends of the extensions toward the side members, and the second distance is greater than a slip distance of the display.

4. The electronic device of claim 3, wherein the respective support portions protrude toward a surface of the display with respect to the extensions.

5. The electronic device of claim 3, wherein the ends of the extensions are spaced apart from an edge of the active area of the display.

6. The electronic device of claim 1, wherein the extensions are configured to maintain a gap with the display in the first direction in an unfolded state or a folded state of the electronic device.

7. The electronic device of claim 1, wherein the extensions are integrally configured with respective support portions.

8. The electronic device of claim 1, wherein the support portions are disposed along respective portions of surfaces of the extensions which face the display.

9. The electronic device of claim 8, wherein a surface of each of the support portions includes a material having a hardness less than a hardness of a surface of the display.

10. The electronic device of claim 8, wherein portions of the surfaces of the extensions are inclined with respect to a surface of the display.

11. The electronic device of claim 8, wherein each of the support portions includes one or more of Teflon tape, polyethylene terephthalate, a polyurethane sheet, or sponge.

12. The electronic device of claim 1,
    wherein the respective support portions comprise a material different from a material of the extensions, and
    wherein each of the support portions includes a material having a hardness less than a hardness of a surface of the display.

13. The electronic device of claim 12, wherein each of the support portions includes a double injection molded support portion or a bonded support portion.

14. The electronic device of claim 1, further comprising coating layers disposed on surfaces of the extensions oriented toward a display surface of the display.

15. An electronic device comprising:
    a hinge configured to enable the electronic device to be rotated into a folded state or an unfolded state;
    a first housing connected to the hinge and including a first surface oriented in a first direction and a second surface oriented in a second direction opposite the first direction;
    a second housing connected to the hinge and including a third surface oriented in a third direction and a fourth surface oriented in a fourth direction opposite the third direction, wherein the second housing is configured to be folded on the first housing about the hinge;
    a flexible display extending from the first surface to the third surface;
    a first bracket comprising a first outer side surface exposed to an outside of the electronic device and a first inner side surface disposed in a space between the first surface and the second surface, the first bracket supporting a portion of the flexible display;
    a second bracket comprising a second outer side surface exposed to the outside of the electronic device, and a second inner side surface disposed in a space between at least the third surface and the fourth surface, the second bracket supporting a remaining portion of the flexible display; and bezels including extensions in contact with a portion of the first bracket and a portion of the second bracket and extending toward a edge portions of the flexible display, wherein the edge portions of the display are overlapped with the extensions and the support portions, wherein a first side surface of the display is configured to be slipped toward the first inner surface when the electronic device is folded, wherein a second side surface of the display is configured to be slipped toward the second inner surface when the electronic device is folded, wherein a first space for the slipping of the first side surface of the display is formed between at least the first side surface of the display and the first inner side surface of the first bracket, and wherein a second space for the slipping of the second side surface of the display is formed between at least the second side surface of the display and the second inner side surface of the side members.

16. The electronic device of claim 15, wherein, in an unfolded state of the electronic device, respective the first inner side surfaces of the first bracket and the second inner side surface of the second brackets are spaced apart from the first side surface and the second side surface of the display by a first distance, and the first distance is greater than a slip distance of the display.

17. The electronic device of claim 15, wherein respective support portions are in contact with the display at least a second distance from ends of the extensions toward the side surfaces of the display, and the second distance is greater than the slip distance of the display.

18. The electronic device of claim 15, wherein the extensions are configured to maintain a gap with the display in the first direction in an unfolded state and/or a folded state of the electronic device.

19. The electronic device of claim 15, wherein the support portions protrude towards the surfaces of the display with respect to the extensions.

20. The electronic device of claim 15, further comprising coating layers disposed on surfaces of the extensions oriented toward the surfaces of the display.

* * * * *